United States Patent
Naffziger

(10) Patent No.: US 8,103,941 B2
(45) Date of Patent: Jan. 24, 2012

(54) LOW OVERHEAD SOFT ERROR TOLERANT FLIP FLOP

(75) Inventor: Samuel D. Naffziger, Fort Collins, CO (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 968 days.

(21) Appl. No.: 12/059,543

(22) Filed: Mar. 31, 2008

(65) Prior Publication Data

US 2009/0249149 A1 Oct. 1, 2009

(51) Int. Cl.
*G06F 11/00* (2006.01)
(52) U.S. Cl. .......................... 714/775; 714/734; 365/154
(58) Field of Classification Search .................. 714/775, 714/798, 799, 780, 724, 733, 734, 30; 365/154, 365/189.06, 189.07, 226, 233.15; 327/200, 327/208, 212, 210, 211, 218
See application file for complete search history.

(56) References Cited

U.S. PATENT DOCUMENTS

| | | | |
|---|---|---|---|
| 5,378,937 A * | 1/1995 | Heidemann et al. | 327/306 |
| 5,712,826 A | 1/1998 | Wong et al. | |
| 5,764,089 A | 6/1998 | Partovi et al. | |
| 5,917,355 A | 6/1999 | Klass | |
| 6,278,308 B1 | 8/2001 | Partovi et al. | |
| 6,356,485 B1 * | 3/2002 | Proebsting | 365/189.16 |
| 6,597,620 B1 | 7/2003 | McMinn | |
| 6,909,637 B2 * | 6/2005 | Nelson et al. | 365/185.07 |
| 7,301,373 B1 | 11/2007 | Bailey et al. | |

OTHER PUBLICATIONS

Karnik, et al "Scaling trends of Cosmic Rays induced Soft Errors in static latches beyond 0.18 pts" 2001 Symposium on VLSI Circuits of Technical Papers, pp. 61-62.
Goel, et al "Low-Overhead Design of Soft-Error-Tolerant Scan Flip-Flops with Enhanced-Scan Capability" 2006 Asia and South Pacific Conference on Design Automation, Jan. 24-27, 2006 pp. 665-670.
Krishnamohan, et al "A Highly-Efficient Techniques for Reducing Soft Errors in Static CMOS Circuits" pp. 126-131, 2004 IEEE International Conference on Computer Design (ICCD'04), 2004.

\* cited by examiner

*Primary Examiner* — Dieu-Minh Le
(74) *Attorney, Agent, or Firm* — Rory D. Rankin; Meyertons, Hood, Kivlin, Kowert & Goetzel, P.C.

(57) ABSTRACT

A system and method for soft error recovery (SER) within a flip-flop. A first stage of the flip-flop receives an ungated input clock signal. A second stage of the flip-flop receives a gated input clock signal. The second stage may also store a prebuffered data output and one or more feedback storage values on separate nodes. The flip-flop has SER circuitry used to recover the prebuffered data output and any feedback storage value without requiring a transition of a clock signal.

20 Claims, 12 Drawing Sheets

LOW OVERHEAD SOFT ERROR TOLERANT FLIP FLOP

BACKGROUND OF THE INVENTION

1. Field of the Invention

This invention relates to electronic circuits, and more particularly, to an efficient method of soft error recovery within a flip-flop.

2. Description of the Relevant Art

Modern microprocessors may include one or more processor cores, or processors, wherein each processor is capable of executing instructions of a software application. Modern processors are typically pipelined, wherein the processors include one or more data processing stages connected in series with storage elements placed between the stages. The storage elements typically are flip-flop circuits. The output of one stage is made the input of the next stage during each transition of a clock signal.

Some processors may have multiple pipelines. Therefore, the number of flip-flop circuits, which has reached the hundreds of thousands on modern designs, has been increasing with each generation of processors. Further, the geometric dimensions of devices and metal routes on each generation of processors is decreasing. This geometric decrease causes a decrease in the capacitance used for storage of charge on nodes of the semiconductor chip, although the cross-capacitance of metal routes increase. Also as the channel lengths of transistors decrease, electrostatic fields at the source and drain terminals of transistors increase, which increases both the hot-electron effects and the potential failure.

In order to both reduce the power consumption of the chip, which is proportional to the square of the power supply voltage, and reduce the electrostatic fields within the transistors, the power supply voltage is decreased as well. There is a limit to the power supply voltage reduction, since this reduction deceases the amount of current that may flow through a transistor and, thus, increases the propagation delays through transistors. If the threshold voltages are reduced in order to turn-on the transistors sooner and aid in maintaining performance, then transistor leakage current increases. An increase in transistor leakage current both increases power consumption and the potential for logic failure.

With both the node capacitance and the supply voltage decreasing over time with the next generations of new processors, the amount of electrical charge stored on a node decreases. Due to this fact, nodes used for storage are more susceptible to radiation induced soft errors caused by high energy particles such as cosmic rays, alpha particles, and neutrons. This radiation creates minority carriers at the source and drain regions of transistors to be transported by the source and drain diodes. The change in charge compared to the total charge, which is decreasing with each generation, stored on a node may be a large enough percentage that it surpasses the circuit's noise margin and alters the stored state of the node. Although the circuit is not permanently damaged by this radiation, a logic failure may occur.

For the above reason, memories such as static random access memory (SRAM) use error correcting code (ECC) to detect and correct soft errors. Sequential elements, such as flip-flops, may use larger capacitance nodes or redundant latches within their design in order to combat soft errors. However, these techniques significantly increase the area and propagation delay of the flip-flop.

In view of the above, an efficient method for detecting and correcting soft errors in a flip-flop circuit is desired.

SUMMARY OF THE INVENTION

Systems and methods for soft error recovery within a flip-flop are contemplated.

In one embodiment, a flip-flop circuit comprises a first stage, a second stage, and soft error recovery (SER) circuitry. The first stage may receive an ungated input clock signal. The second stage may receive a gated input clock signal. The second stage may also store a prebuffered data output and one or more feedback storage values on separate nodes. The SER circuitry may be used to recover the prebuffered data output and any feedback storage value without a transition of any clock signal.

Also contemplated is a method to store a prebuffered data output and one or more feedback storage values on separate nodes. Both an ungated input clock signal and a gated input clock signal are received in order to store an input data value on the prebuffered data output node. The method is able to recover the prebuffered data output and any feedback storage value without a transition of any clock signal.

These and other embodiments will be appreciated upon reference to the following description and accompanying figures.

Figure 1:
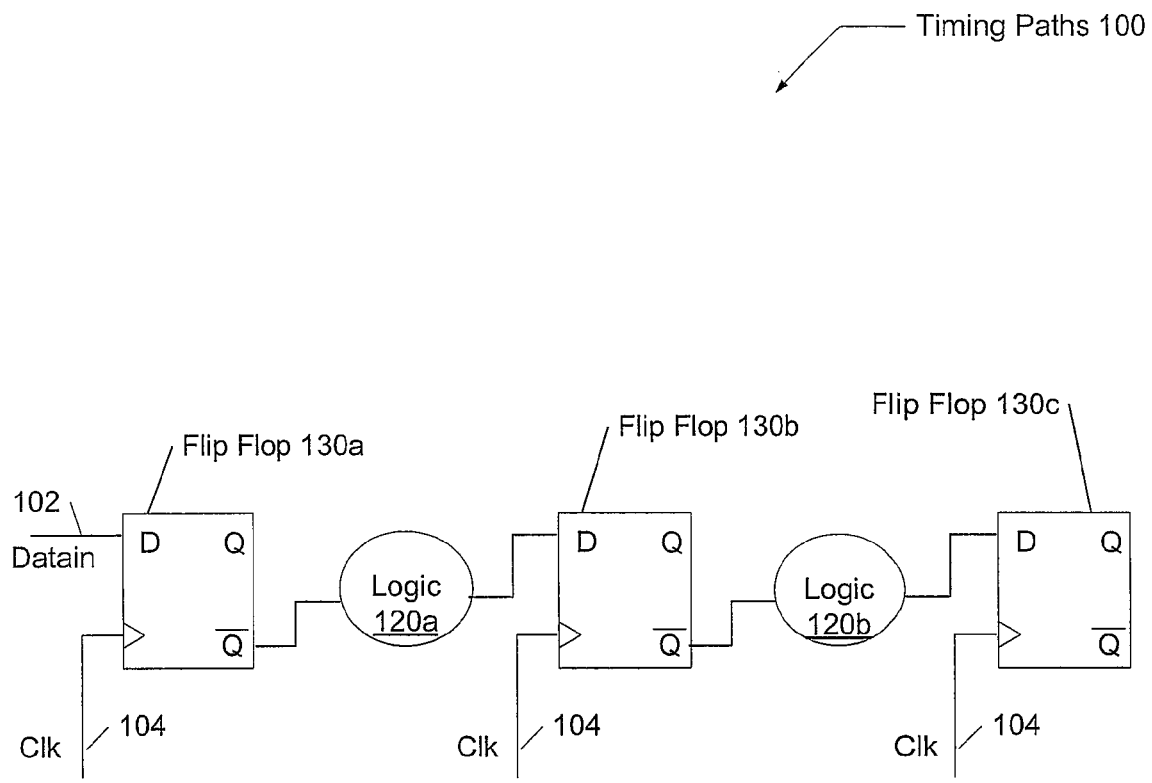
FIG. 1 is a generalized block diagram illustrating one embodiment of a series of timing paths using flip-flop circuits.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

Referring to FIG. 1 one embodiment of a series of timing paths 100 using flip-flop circuits is shown. This embodiment does not include all examples of timing paths such as replacing a flip-flop circuit with a single latch circuit, replacing combinatorial logic with dynamic logic, or replacing logic with a memory such as a random access memory (RAM) cell or a register file circuit. The embodiment shown is for a simple illustrative purpose.

Flip-flop circuits 130a-130c may use a master-slave latch configuration. Flip-flop circuits 130a-130c may also include single or double output lines, and one of many embodiments for feedback circuits and scan circuitry. As used herein, elements referred to by a reference numeral followed by a letter may be collectively referred to by the numeral alone. For example, flip-flop circuits 130a-130c may be collectively referred to as flip-flop circuits 130. A data input signal is received by line Datain 102. In this embodiment, flip-flops 130a and 130c receive a same clock signal, ClkA, on line 104.

A first timing path exists between the output of flip-flop 130a and the input of flip-flop 130b. Combinatorial logic, Logic 120a, receives the output of flip-flop 130a, performs combinatorial computations dependent on the output of flip-flop 130a, and conveys an output value to the input of flip-flop 130b. A second timing path including logic 120b exists between flip-flops 130b-130c.

Figure 2:
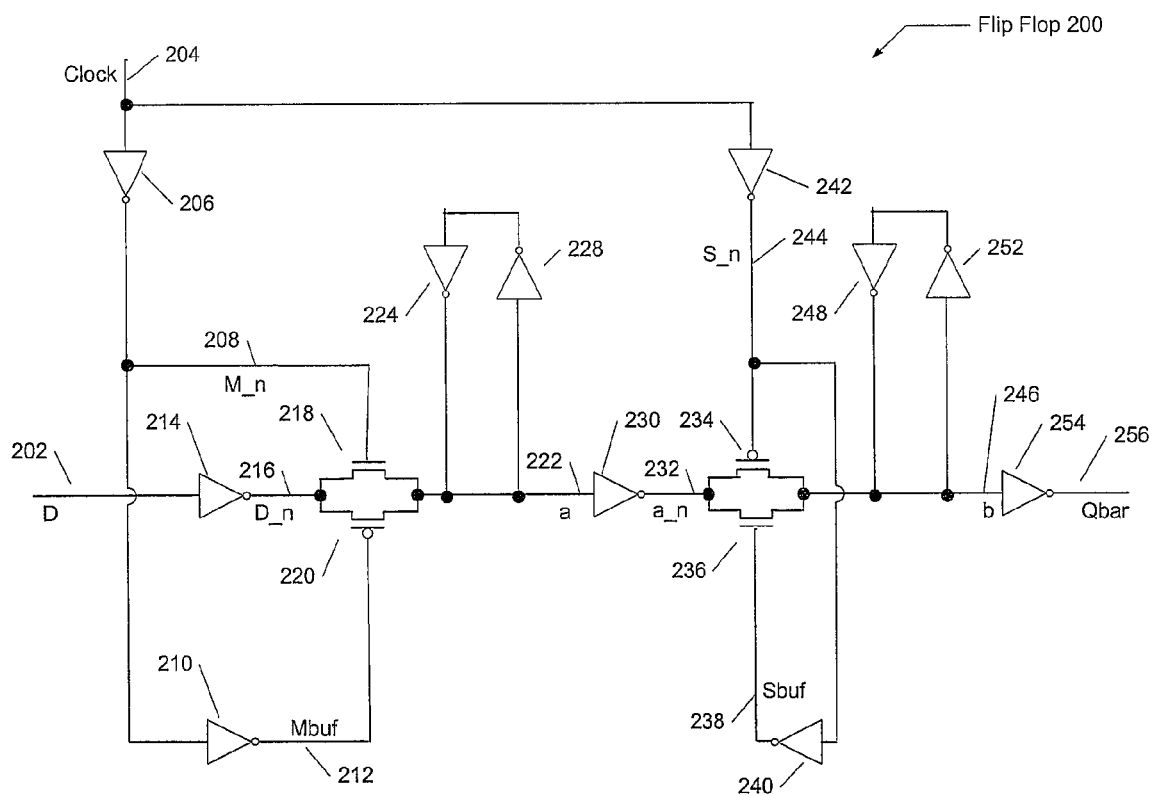
FIG. 2 is a generalized diagram illustrating one embodiment of a flip-flop circuit.

FIG. 2 illustrates one embodiment of a flip-flop circuit 200. This particular embodiment is a positive-edge triggered flip-flop comprising pass-gates, or transmission gates, to implement a master latch and a slave latch. One skilled in the art knows other embodiments may include a negative-edge triggered design, and the master-slave configuration may be implemented with other transistor topologies such as sense amps, C2MOS topology, dynamic circuits, differential inputs, and other design choices. Output data from combinatorial logic, dynamic logic, sequential elements such as latches, other flip-flop circuits, or other is received by the data input line Din 202. A clock signal is received by input clock line 204. A transition of the clock signal (i.e. changing from a logic low value to a logic high value in the positive-edge triggered example) initiates logic value state changes within the flip-flop circuit 200. A logic high value may be equivalent to the value of a power reference and a logic low value may be equivalent to the value of a ground reference. Inverters 206 and 242 provide inverted values of the received clock signal on lines 208 and 244, respectively. Inverters 210 and 240 provide non-inverted values of the received clock signal on lines 212 and 238, respectively. Also, it is possible to use only two inverters, rather than four inverters, to supply the appropriate value of the clock signal to the master and slave latches. However, the use of four inverters may be used to reduce the capacitive loading on the clock line 204. For example, inverters 206 and 242 may isolate the internal nodes of the flip-flop from the clock line 204, which may aid in reducing the sizing of clock buffers higher up in the clock distribution system. Also, inverters 206, 210, 242, and 240 provide unconditional buffered clock signals, since the output clock signals from these inverters do not depend on any other signals or logic.

In this embodiment, a master latch may be implemented by devices 214, 218, and 220. Inverter 214 provides an inverted value, Din_n 216, of the value on line Din 202 to a transmission gate implemented by transistors 218 and 220. A slave latch is implemented by devices 230, 234, and 236. Inverter 230 provides an inverted value, a_n 232, of the output value, a 222, of the master latch transmission gate. The slave latch transmission gate is implemented by transistors 234 and 236. An inverter 254 buffers the output of the slave latch, b 246, and provides the output of the flip-flop circuit, Qbar 256. Node b 246 is the prebuffered data output of the flip-flop 200. Also node b 246 is the internal stored state of flip-flop 200. Output inverter 254 also isolates the output capacitance of the flip-flop circuit from the slave latch transmission gate.

The master latch and slave latch receive inverted clock signals respective of one another. In the positive-edge triggered embodiment shown, the clock lines 208 and 212 are coupled to the transmission gates in a manner to provide the respective inverted clocking. When the received clock signal on line 204 has a logic low value, the master latch is transparent and transmits values from the data input line 202 to node 222. At the same time, the slave latch is opaque and no data transmission from node 232 to node 246 occurs. When the clock signal on line 204 transitions from a logic low value to a logic high value, the reverse scenario occurs and the master latch is opaque and the slave latch is transparent.

In this manner, the output node 256 is dependent on the data input line 202 and the clock signal on line 204. In one embodiment, inverters 224, 228, 248, and 252 are used as feedback circuits on the output nodes of the transmission gates. Without the feedback circuits, when the transmission gates are opaque, there is no driver to ensure their output values are not lost. In the embodiment shown the output value on node 256 is an inverted value of the data input line 202 when the master latch becomes opaque. In alternative embodiments, a separate output may be included in circuit 200 to convey a non-inverted value. Also, in alternative embodiments, modern designs may have one of many embodiments of scan circuitry included in the flip-flop circuit 200 for testing purposes. For simplicity, a scan circuit is not shown.

Figure 3:
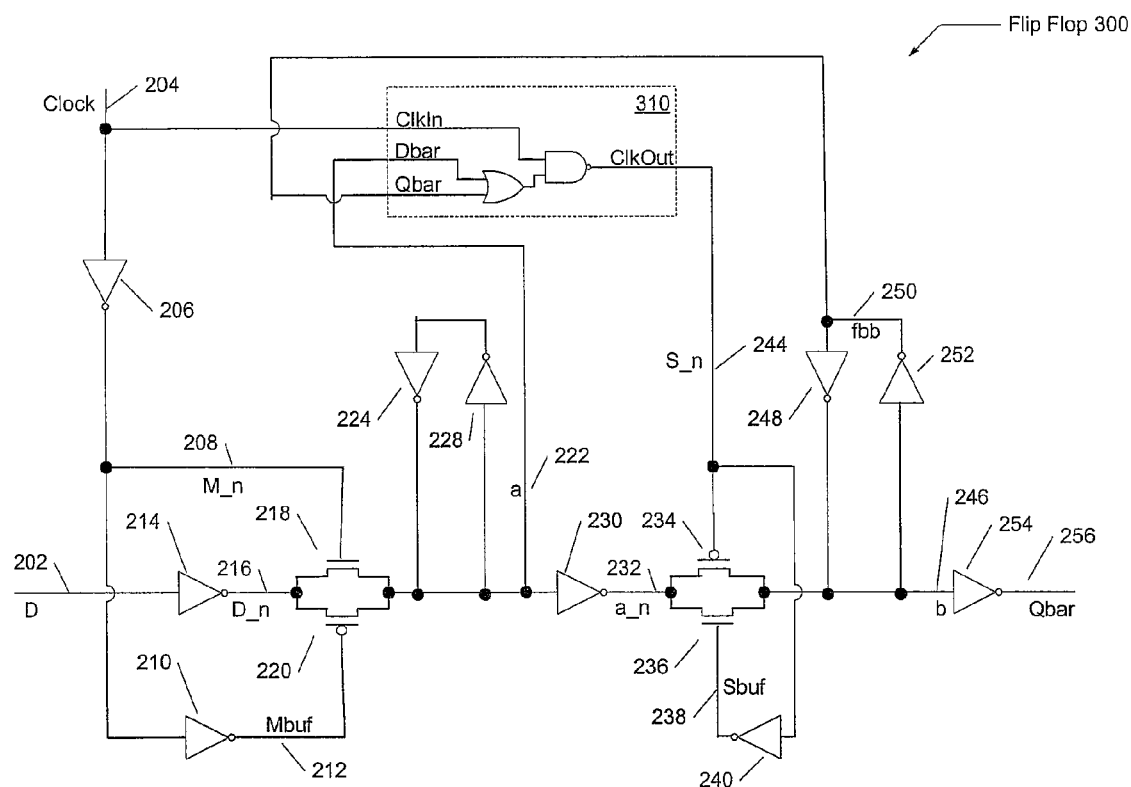
FIG. 3 is a generalized diagram illustrating one embodiment of a flip-flop circuit with a simplified conditional technique for reducing power consumption.

FIG. 3 illustrates one embodiment of a flip-flop circuit 300 with a simplified conditional technique for reducing power consumption and reducing the time the slave latch is susceptible to soft errors. Circuit 300 is the same flip-flop as shown in circuit 200 except for the replacement of inverter 242 with an OR-AND-Inverter (OAI) gate 310. One input to the OAI gate 310 is the received ungated clock signal on line 204. A second input is an inverted value of the stored state of the flip-flop, or an inverted value of the output of the slave latch transmission gate, node fbb 250. The third input is the output of the master latch transmission gate, node a 222, or the inverted value of the input data, D 202.

The OAI gate 310 conditionally disables the received ungated clock input 204 and provides a gated clock input signal S_n 244 to the slave transmission gate. When the stored state of the flip-flop, node fbb 250, and the data input, node a 222, have a same logic low value, the slave latch clock lines 244 and 238 continue to keep the slave transmission gate opaque. Any toggling of the received clock line 204 is not able to turn on the slave latch transmission gate.

Following modern CMOS design techniques, the inputs to the OAI gate 310 are arranged with the earliest arriving signal routed the farthest away from the output node S_n 242. This technique allows intermediate nodes of gate 310 to charge or discharge before the latest arriving signal does arrive. Therefore, the propagation delay of gate 310 is reduced. Here, the earliest arriving signal is the stored state of the flip-flop, fbb 250. Its value is set when a new value is stored in the flip-flop upon the rise of the received clock 204. Therefore, signal fbb 250 is routed the farthest away from the output node.

The middle input of gate 310 is node a 222. A value arrives on this node when computations performed by logic between flip-flops have completed during the clock cycle and meet the flip-flop setup time requirement. Finally, the rising edge of the received clock signal 204 arrives last and it is routed to the nearest input of gate 310 to the output of gate 310 as shown in FIG. 3.

Gate 310 may take advantage of the fact that a flip-flop stored state does not change often, such as less than 2% of the time, and that the majority of flip-flops store a state of a logic low value. Therefore, if a flip-flop is not going to change state, or nodes 222 and 250 have the same value prior to the arrival of the received clock signal 204, then there is no need to supply a clock signal to the slave latch. Further, a full comparison, implemented by an XOR gate, of the values of the nodes 222 and 250 is not needed if the majority of the time node 250 has a logic low value. Then gate 310 may be used in place of a full XOR gate. Gate 310 requires less transistors and has a smaller delay penalty than a full XOR gate. Circuit designers, both custom designers and synthesis designers, may aid the reduction of power consumption by designing logic to provide inputs to flip-flop circuits, such as flip-flop 300, that place a logic low value on internal nodes 222 and 250.

As stated above, motivation for implementing the OAI gate 310 in a flip-flop, such as in FIG. 3 may be to both reduce power consumption by decreasing the time internal nodes switch and to reduce the time the slave latch is susceptible to soft errors. For example, in one embodiment, a processor may have a duty cycle for the clock signals of 50%, which allows the slave transmission gate to be transparent 50% of the time. Also, power reduction techniques may disable the clock signal in the global distribution system at one or more stages prior to the clock signals arriving to the flip-flops. This global or block-level clock gating may disable the clock signal 70% of the time. Therefore, the slave transmission gate may be transparent only 30% of the original 50% of the time, which is 15% of the time.

Figure 11:
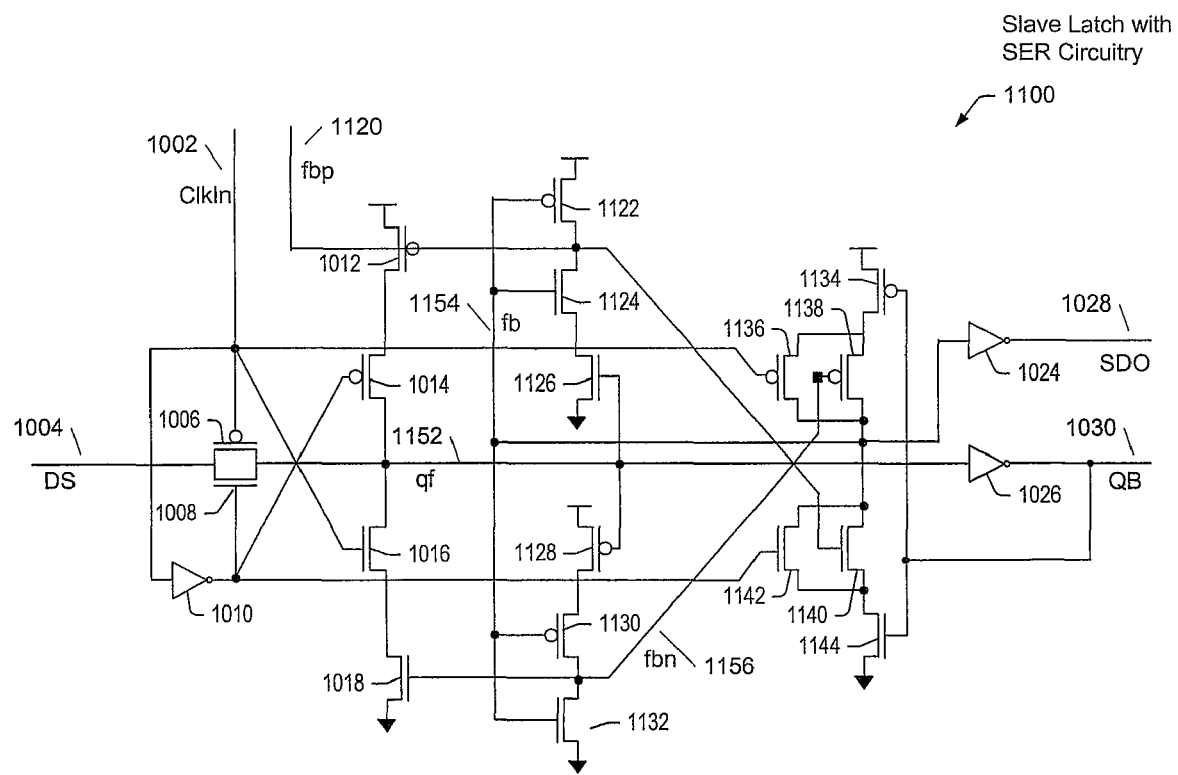
FIG. 11 is a generalized diagram illustrating one embodiment of an alternative embodiment of a slave latch with soft error recovery circuitry.

In one embodiment, now clock gating performed by circuits such as OAI gate 310, which take advantage of the fact that flip-flops may not need to change a stored internal state of a logic high value, such as node b 246, 63% of the time. Thus, the slave transmission gate may be transparent 37% of the 15% derived above, which is 5.6% of the time. By making the transmission gate opaque 94.4% of the time, the slave latch internal nodes are not susceptible to soft errors that occur in the master latch. However, these internal nodes are susceptible to soft errors within the slave latch during this 94.4% time period. Circuitry to detect and correct soft errors in the slave latch while the slave transmission gate is opaque is shown in FIG. 11 and will be described later.

Figure 4A:
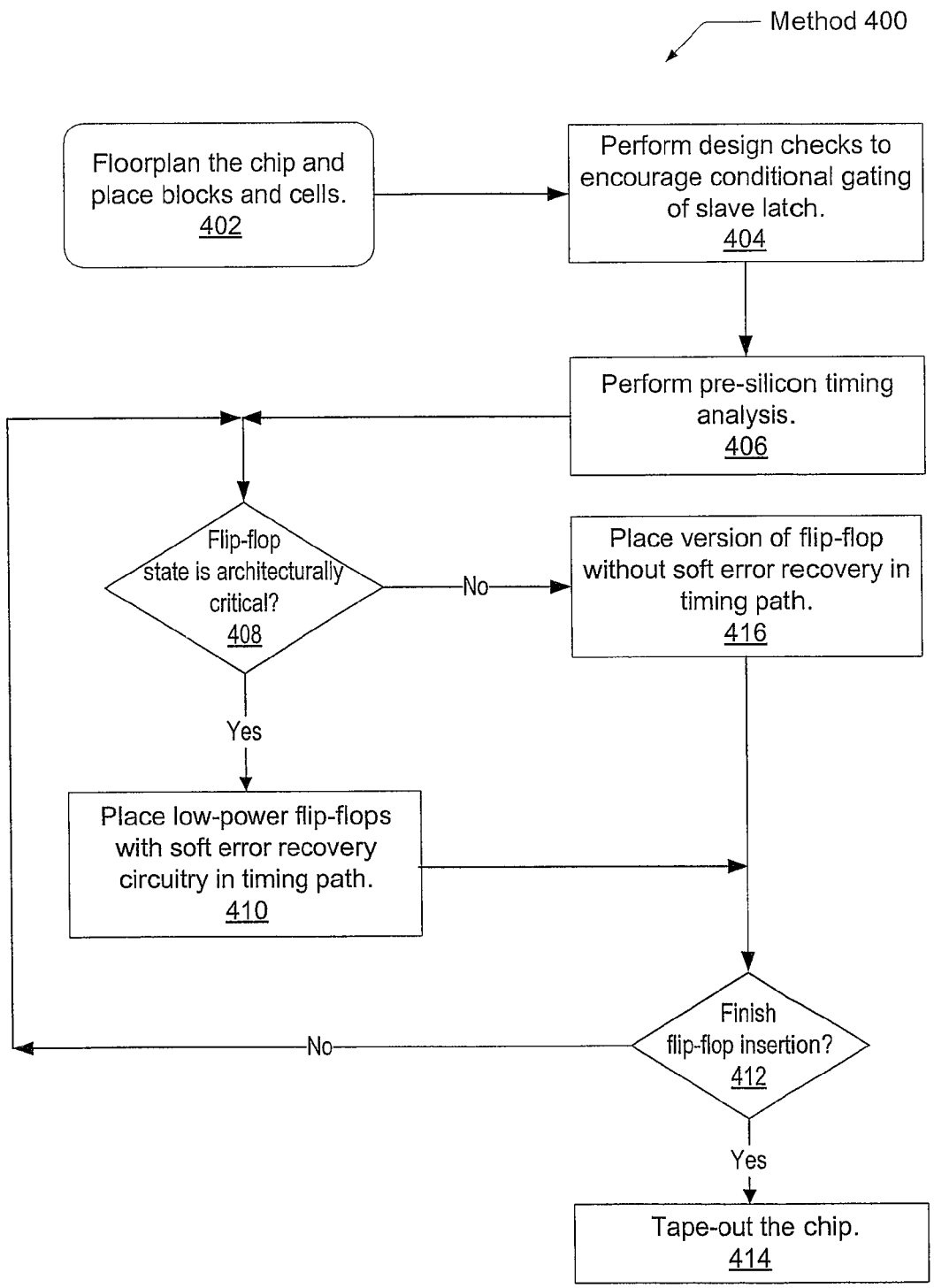
FIG. 4A is a general block diagram illustrating one embodiment of a method for reducing soft errors occurring on a semiconductor chip.

FIG. 4A illustrates a method 400 for reducing soft errors occurring on a semiconductor chip. Method 400 may be modified by those skilled in the art in order to derive alternative embodiments. Also, the steps in this embodiment are shown in sequential order. However, some steps may occur in a different order than shown, some steps may be performed concurrently, some steps may be combined with other steps, and some steps may be absent in another embodiment. In the embodiment shown, a semiconductor chip is floorplanned and individual blocks and cells are placed according to the floorplan in block 402.

In block 404, architectural logic is verified and design checks are performed. Some of these design checks may be used to ensure circuits meet noise thresholds, migration current thresholds, and other predetermined criteria. Another design check may be utilized to encourage conditional gating of a second stage, or a slave latch, of a flip-flop. For example, in one embodiment, storage of a logic low value, or a value equivalent to a ground reference, in flip-flops may be used to conditionally gate, or turn-off, the clock signal to the slave latch. An example of such a technique is further described later. Custom circuit designers and synthesis designers, such as programmers using register transfer language (RTL) synthesis tools, may design their cells and blocks to place a logic low value both on the input data line and the internal stored node of the slave latch of flip-flop circuits. Such a design requirement may be used in a complex gate used to disable a clock signal to the slave latch. In this manner, the slave transmission gate is opaque the majority of the time and internal switching of flip-flop nodes is decreased. Therefore, both power consumption reduces and soft error susceptibility reduces. The reduction in soft error susceptibility is due to the slave transmission gate being opaque and any voltage noise on nodes prior to the slave transmission gate is not able to affect nodes subsequent the slave transmission gate.

Pre-silicon timing analysis is performed in block 406. Timing paths and circuits are redesigned and transistors are resized in order to meet the target clock cycle for the chip design. If a flip-flop is determined to be architecturally critical to the design of the chip (conditional block 408), then a flip-flop utilizing soft error detection and recovery circuitry may be inserted in a corresponding timing path in block 410. In one embodiment, the architecturally critical flip-flop may not be in a timing critical path and a low-power flip-flop utilizing a complex gate to conditionally disable a slave latch clock input may be inserted in the timing path in block 410. If the timing path does not meet a predetermined timing threshold or the corresponding stored data is not architecturally critical (block 408), then another flip-flop version may be chosen to be inserted in the timing path in block 416.

If all timing paths have been inspected and the appropriate flip-flop circuit has been inserted in the timing paths (block 412), then the chip is ready for tape-out as long as all other design requirements not affecting flip-flop insertion have been satisfied also in block 414. If all timing paths have not yet been inspected (block 412), control flow returns to conditional block 408.

Figure 4B:
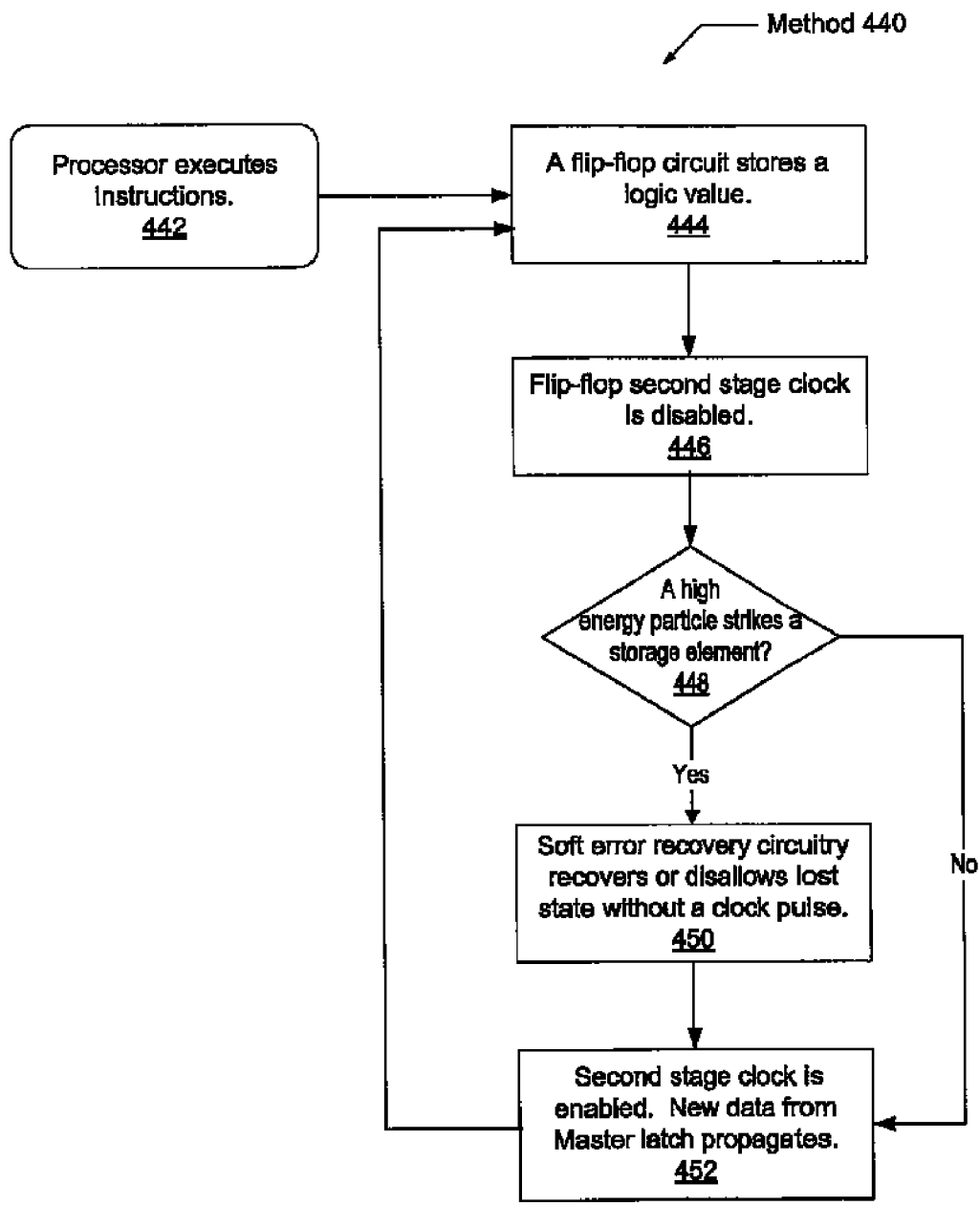
FIG. 4B is a general block diagram illustrating one embodiment of a method for detecting and correcting soft errors within a flip-flop.

FIG. 4B illustrates one embodiment of a method for detecting and correcting soft errors within a flip-flop. As with method 400, method 440 may be modified by those skilled in the art in order to derive alternative embodiments. Also, the steps in this embodiment are shown in sequential order. However, some steps may occur in a different order than shown, some steps may be performed concurrently, some steps may be combined with other steps, and some steps may be absent in another embodiment. In the embodiment shown, a processor executes instructions in block 442. Flip-flop circuits store states used by logic on the semiconductor chip. A particular flip-flop that uses soft error recovery circuitry as described by the invention later stores an architecturally critical state on an internal node of its second state, or slave latch, in block 444.

An input clock signal to the slave latch of the flip-flop is disabled in block 446. This clock gating may be performed when the input data to the flip-flop and the stored internal state of the flip-flop have the same logic value. In this case, the output of the flip-flop is not going to change value, and it is unnecessary to have switching of internal nodes of the flip-flop. In one embodiment, the clock gating may only occur when the input data and the stored internal state have a same value of only a particular value, such as a logic high value and not a logic low value. This further restriction allows the clock gating to require less area and less delay penalty. Referring again to FIG. 3, in one embodiment, the OAI gate 310 may provide clock gating of the slave latch. When the input data D 202 and the stored internal state b 246 both have a logic low value, the input clock to the slave latch, S_n 244, is disabled, which causes the slave latch to remain opaque. Power consumption is reduced. Also, any voltage noise caused by radiation on a node between node 202 and node 232 can not affect the stored internal state b 246.

If radiation hits a node in the slave latch (conditional block 448), soft error recovery circuitry either disallows a stored state to occur or it recovers the lost state in block 450. The circuitry can perform both operations without a clock pulse. In short, this circuitry uses feedback nodes and transistor sets to perform these operations without a clock pulse. This circuitry is shown in FIG. 11 and is described later.

If no radiation hits a node in the slave latch (conditional block 448), or the internal state was restored or unaffected by a radiation hit (block 450), then flow control goes to block 452. In block 452, eventually the slave latch clock needs to be enabled. For example, the input data to the flip-flop provides a logic low value that meets the setup time of the flip-flop. The slave latch clock is enabled and the new data value propagates through the slave transmission gate to the stored internal state node. Afterwards, control flow of the method returns to block 444.

Figure 5:
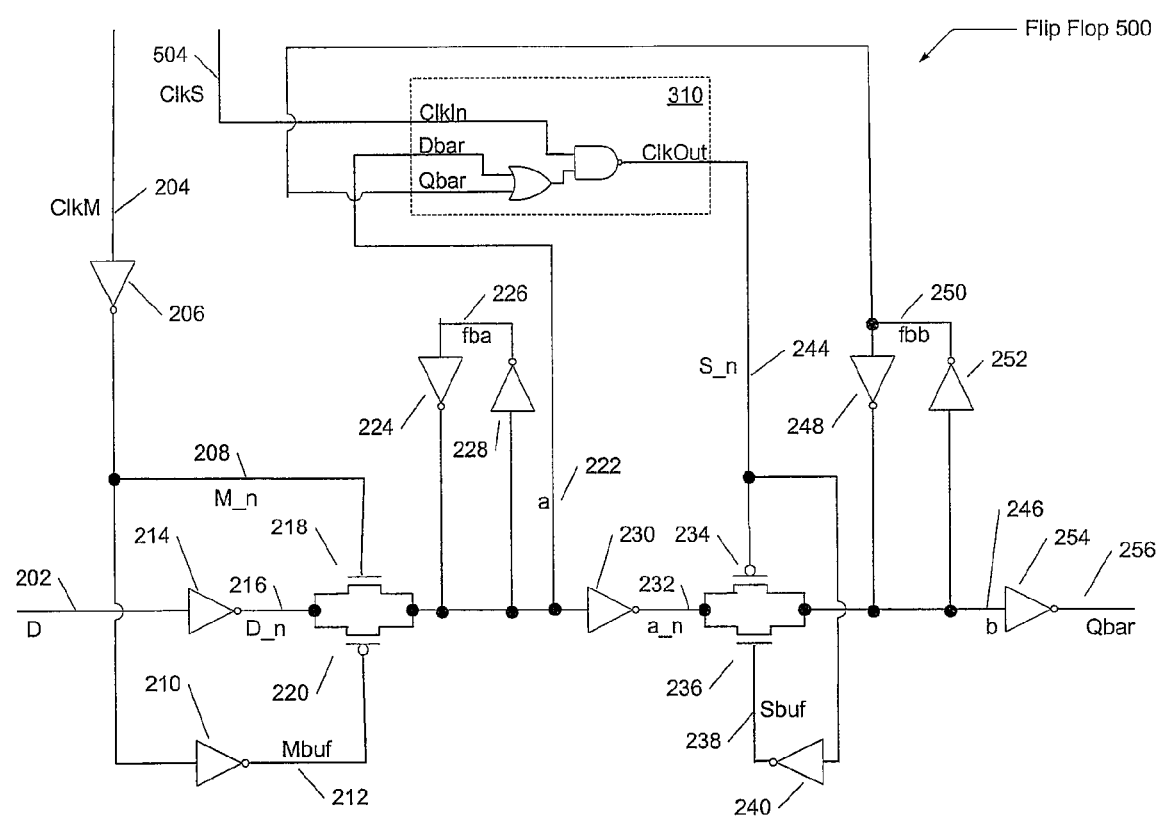
FIG. 5 is a generalized diagram illustrating one embodiment of a flip-flop circuit with split clocks.

Referring to FIG. 5, one embodiment of a flip-flop circuit 500 with split clocks is shown. The flip-flop circuit 300 is provided, but with an additional clock signal, a separate slave clock signal, provided on line 504. This additional clock signal along with nodes 222 and 250 determines when the slave transmission gate is transparent or opaque. The master clock signal may have the same duty cycle as the slave clock signal and be in phase with the slave clock signal, but a delay may exist between the rising and falling edges of the slave clock signal and the respective edges of the master clock signal. A design with the split clocks and a delayed master clock signal may be used to shift the rising edge of the master clock, which is used to define the setup time of the flip-flop. This shifting allows a timing path prior to the flip-flop to have more time for logic computations without increasing the clock cycle. Timing waveforms that display this shifting and increase in computation time is described later.

Figure 6:
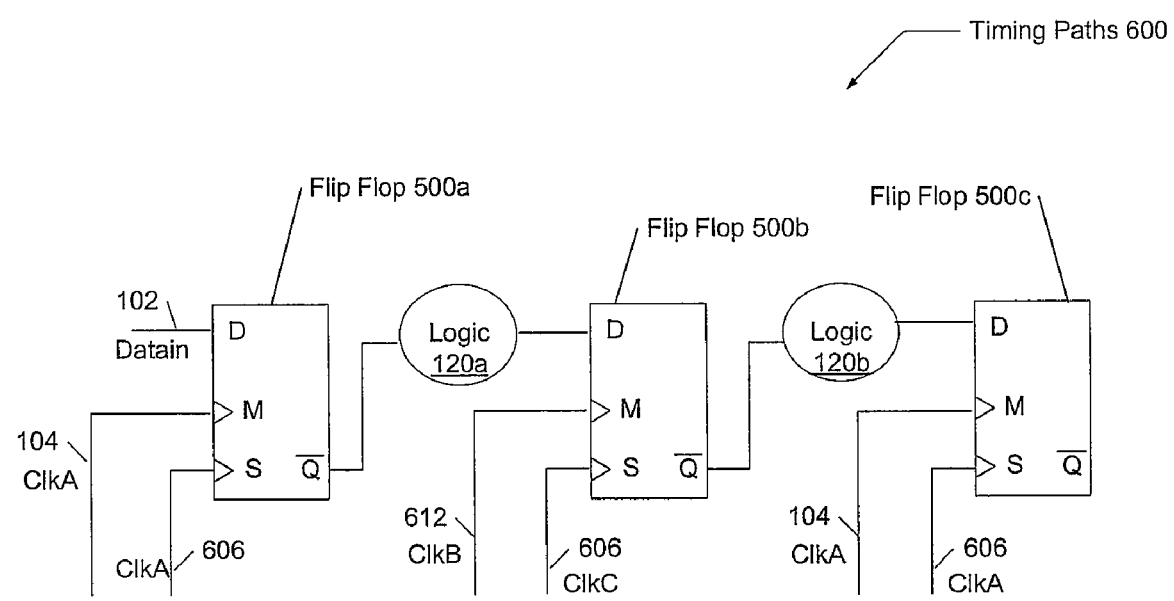
FIG. 6 is a generalized diagram illustrating one embodiment of a series of timing paths using flip-flop circuits with split clocks.

FIG. 6 illustrates one embodiment of a series of timing paths 600 using flip-flop circuits with split clocks. This embodiment as with the embodiment shown in FIG. 1 does not include all examples of timing paths, but shows one example for a simple illustrative purpose.

Flip-flop circuits 500 may use a master-slave latch configuration. Flip-flop circuits 500 may also include single or double output lines, and one of many embodiments for feedback circuits and scan circuitry. A data input signal is received by line Datain 102. In this embodiment, flip-flops 500a and 500c receive a same master clock signal, ClkA, on line 104. Flip-flop circuit 500b receives a master clock signal, ClkB, on line 612. Each flip-flop 500 receives a slave clock signal ClkC on line 606. A description of these clock waveforms is described next.

Figure 7:
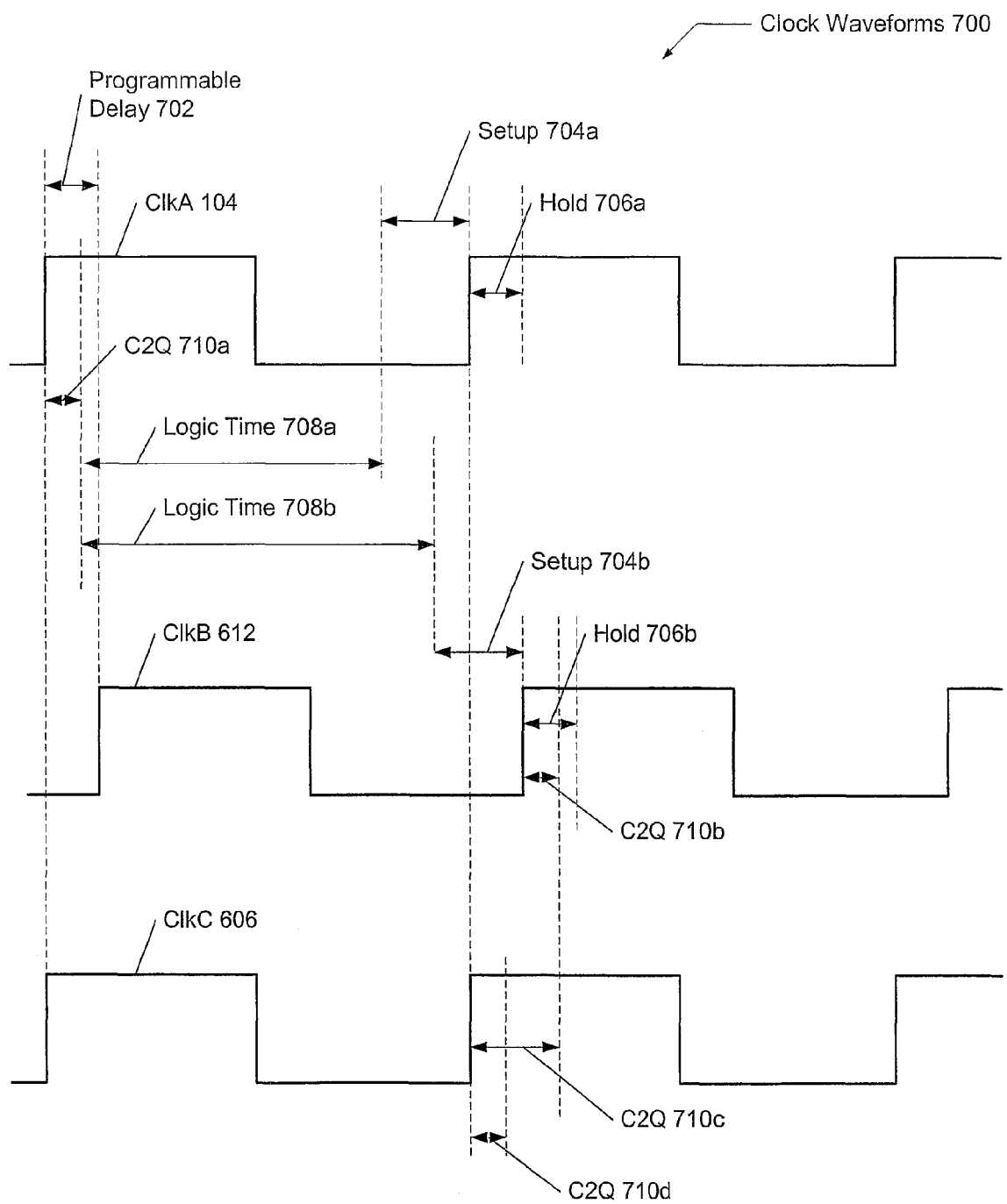
FIG. 7 is a generalized diagram illustrating one embodiment of clock waveforms used for the timing requirements of timing paths using flip-flop circuits with split clocks.

FIG. 7 illustrates one embodiment of the clock waveforms 700 used for the timing requirements of timing paths shown in FIG. 6. As can be seen here, master clock waveform ClkB 612 has a same duty cycle as master clock waveform ClkA 104, but is delayed from ClkA 104 by a programmable delay value 702. In one embodiment, this delay may be implemented by clock delay circuits within the clock distribution system and delay 702 may be set in post-silicon in order to ease fixing timing paths in post-silicon. In one embodiment, the Programmable Delay 702, may be implemented in post-silicon, or after the semiconductor chip is fabricated and returned for testing. Failing timing paths, such as the timing path with Logic 220a, may be fixed in post-silicon by changing the clock signal supplied to flip-flop 230b from ClkA 104 to ClkB 612.

Slave clock waveform ClkC 606 is shown to have the same duty cycle as master clock waveform ClkA 104 with no delay. In alternative embodiments, a non-zero delay may exist between master clock ClkA 104 and slave clock ClkC 606 and this delay value may be different from the value of the programmable delay 702.

Flip-flop 500a may have a clock-to-Q value, C2Q 710a, which represents the delay between the time the clock signal rises and the output of flip-flop 500a is present on its output line. Flip-flop 500a may have a setup time of Setup 704a that requires the input signal on its input line to remain stable for a minimum duration prior to the rise of the master clock signal. This duration may be defined by the delay of the inverter supplying the inverted input data value to the master transmission gate and the delay of the master transmission-gate. Further, the delay is extended by a transistor delay by OAI gate 310. If the data input signal is not stable for the setup duration prior to the clock rising, then the input data value may not have time to be stored by the master latch.

Also, flip-flop 500a may have a hold time value of Hold 706a that requires the input signal on its input line to remain stable for a minimum duration subsequent the rise of the clock signal. This duration may be defined by the delay of the inverter supplying the inverted input data value to the master transmission gate and the delay of the master transmission gate. If the data input signal is not stable for the hold duration subsequent to the clock rising, then the input data value may have time to over-write the required value to be stored by the master latch.

Flip-flop 500b may have a setup time, Setup 704b. Due to the programmable delay 702 that delays the clock edge transitions of master clock waveform ClkB 612 with respect to master clock waveform ClkA 104, Logic 220a has more time for computations represented by Logic Time 708b. If flip-flop 500b received master clock ClkA 104 instead, then Logic 220a only has time for computations represented by Logic Time 708a, which is smaller. Since the duty cycles of ClkA 104 and ClkB 612 are the same, the frequency of the design did not change, but more time was given to Logic 220a to perform computations by the use of master clock Clk B 612 provided to flip-flop 500b.

Because the slave clock Clk C 606 provided to flip-flop 500b is not delayed as its master clock Clk B 612, this implementation does not increase the perceived C2Q value of the subsequent timing path. Therefore, the C2Q delay of flip-flop 500b is shown as C2Q 710d. If flip-flop 500b did not have split clocks, but only received a single clock, and its slave clock was delayed the same amount as the master clock, then the C2Q delay of flip-flop 500b, C2Q 710b, would be delayed and provide the perceived delay value of C2Q 710c. However, this is not the case as flip-flop 500b has a separate slave clock, ClkC 606, which is not delayed.

However, the split clocks do provide a design trade-off. The hold time of flip-flop 500b, Hold 706b, is delayed, since its master clock waveform, ClkB 612, is delayed. Therefore, Logic 220*a* must provide a stable value to the input of flip-flop 500*b* for a longer duration than required without a delayed master clock. However, this timing requirement may be easily many for many paths.

Figure 8:
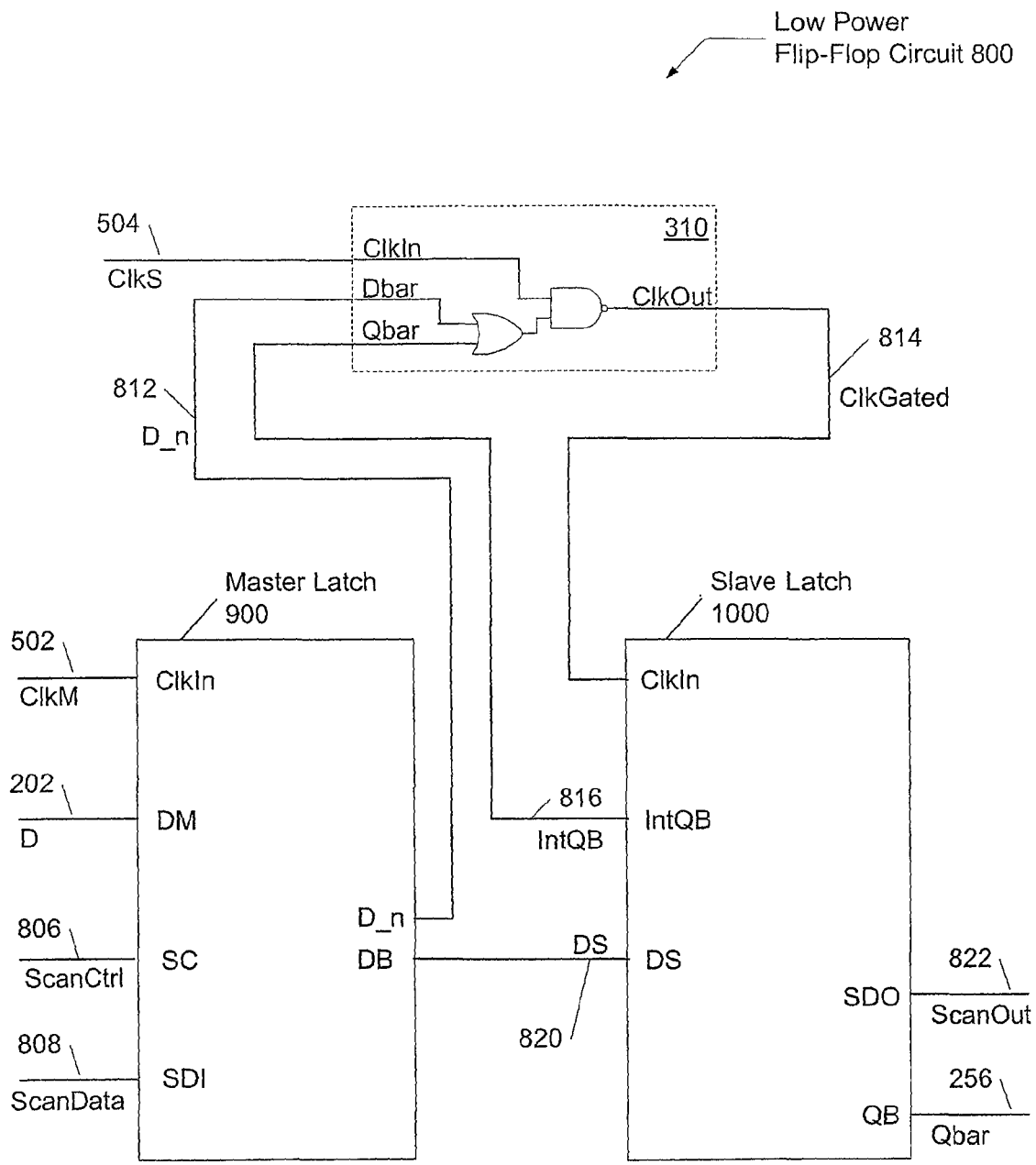
FIG. 8 is a generalized diagram illustrating one embodiment of an alternative embodiment of a low power flip-flop circuit.

Referring to FIG. 8, an alternative embodiment of a low power flip-flop circuit 800 is shown. Flip-flop 800 is similar to flip-flop 500 shown in FIG. 5, but the master latch and slave latch include different feedback circuits and include scan test circuitry, which will be shown shortly.

A data input signal is provided on line 202 as before. A master clock signal and a separate slave clock signal are provided on lines 502 and 504, respectively, as described above. One input to the OAI gate 310 is the received separate slave clock signal on line 504. A second input is an inverted value of the stored state of the flip-flop, or an inverted value of the output of the slave transmission gate within slave latch 1000. This value is routed on line IntQB 816. The third input is the output of the master transmission gate within master latch 900. This value is routed on line D_n 812.

Again, the OAI gate 310 conditionally disables the received slave clock input 504. When the values on the lines 812 and 816 have a same logic low value, the gated clock signal ClkGated 814 continues to keep the slave transmission gate opaque within slave latch 1000. Any toggling of the received separate slave clock line 504 is not able to turn on the slave transmission gate.

The output of the master transmission gate is routed to the input of the slave transmission gate on line DS 820. A scan test control signal, ScanCtrl 806, and a scan test data signal, ScanData 808, are provided to the master latch 900. A scan output signal, ScanOut 822, and the flip-flop data output signal, Qbar 256, are conveyed by the slave latch 1000.

Figure 9:
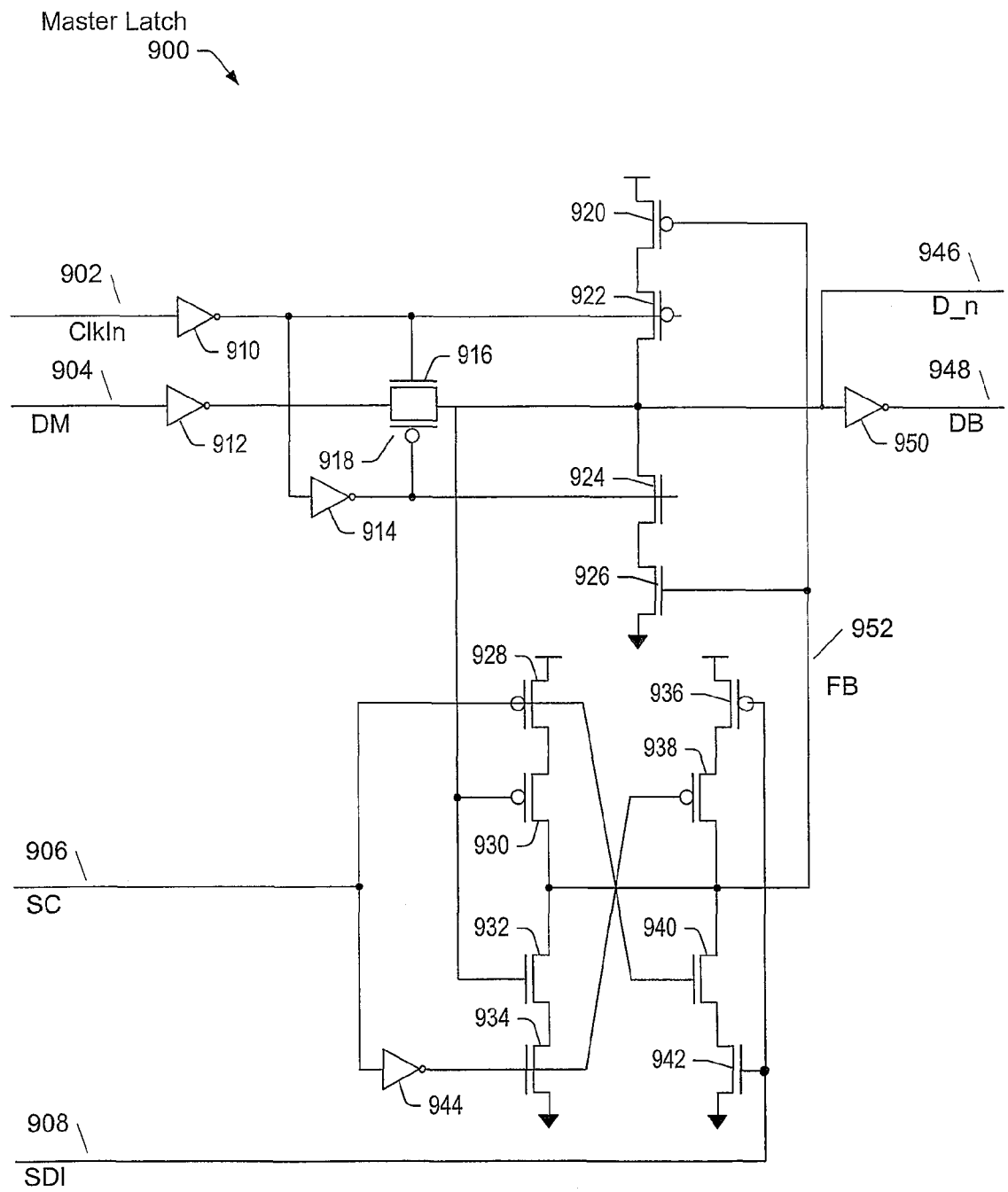
FIG. 9 is a generalized diagram illustrating one embodiment of an alternative embodiment of a master latch.

FIG. 9 illustrates an alternative embodiment of a master latch with circuit 900. Inverter 912 provides an inverted value of the received data input value on line DM 904 to a master transmission gate implemented by transistors 916 and 918. Inverter 910 provides an inverted value of the received input clock signal on line 902. Inverter 914 provides a buffered non-inverted value of the received input clock signal on line 902. Inverter 950 buffers the output of the master transmission gate and conveys the output DB 948 to an outside slave latch. The output of the master transmission gate, D_n 946, is routed out of the master latch and to the outside OAI gate 310.

When the received clock signal on line 902 has a high logic value and causes the master transmission gate to become opaque, the node D_n 946 needs a driver to maintain the value latched by the master latch 900. During operation, the scan test inputs, SC 906 and SDI 908, are each set to a logic low value. Therefore, transistors 938 and 942 are turned off and do not conduct. Therefore, the set of transistors 936-942 do not drive the feedback node FB 952.

The set of transistors 928-934 has at least one conduction path to a power reference or to a ground reference and, therefore, this set does drive the feedback node FB 952. An inverted value of the node D_n 946 is driven onto node FB 952 by this set of transistors. The set of transistors 920-926 has at least one conduction path to a power reference or to a ground reference and this set drives a non-inverted value of the node D_n 946 back onto this same node and completes the feedback network.

During testing, the received scan test control signal SC 906 is asserted to a logic high value. The set of transistors 928-934 now do not have a conducting path to a power reference or a ground reference and this set does not drive the node FB 952. Now the set of transistors 936-942 has at least one conducting path to a power reference or a ground reference dependent upon the received scan test data input SDI 908. An inverted value of the input SDI 908 is driven onto node FB 952. Again, the received clock signal on line 902 has a high logic value and causes the master transmission gate to become opaque. The set of transistors 920-926 has at least one conducting path to a power reference or a ground reference dependent upon the node FB 952. An inverted value of node FB 952 is driven onto node D_n 946. This value is the same as the received input SDI 908.

Figure 10:
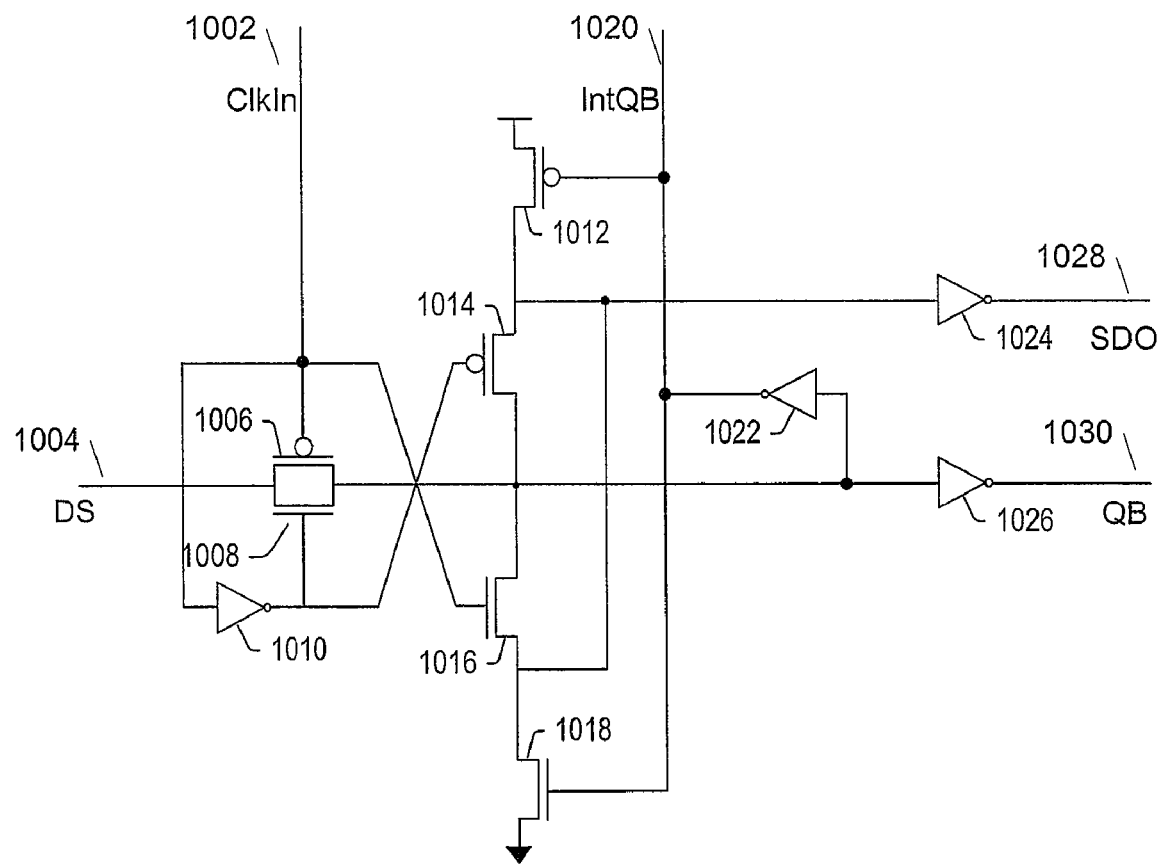
FIG. 10 is a generalized diagram illustrating one embodiment of an alternative embodiment of a slave latch without soft error recovery circuitry.

FIG. 10 illustrates an alternative embodiment of a slave latch 1000 without soft error detection and correction circuitry. The output data of a master latch, whether it is during normal operation or during testing, is received on line DS 1004, which is provided to a slave transmission gate implemented by transistors 1006 and 1008. The gated clock output of the OAI gate 310 is received on line 1002. Inverter 1010 provides an inverted value of the received input clock signal to the slave transmission gate. Both the non-inverted and inverted values of the received clock signal on line 1002 are provided to the set of transistors 1012-1018 used as a feedback network.

A transparent slave transmission gate provides the received data input DS 1004 to inverters 1022 and 1026. Inverter 1026 buffers this value and provides an inverted value as the output of the slave latch on line QB 1030. Inverter 1022 provides the same logic value as QB 1030 to the feedback network implemented by the set of transistors 1012-1018 and to the output node IntQB 1020, which is received by the outside OAI gate 310.

When the slave transmission gate is opaque, transistors 1014 and 1016 are on and may conduct. The logic value of the node IntQB 1020 determines if the set of transistors 1012-1018 has a conducting path to a ground reference or to a power reference. Therefore, the output of the slave transmission gate is still driven. The input of inverter 1024 has an inverted logic value of the node IntQB 1020. Inverter 1024 provides the output value SDO 1028, which is the same logic value as the output value QB 1030.

Referring to FIG. 11, one embodiment of a slave latch 1100 with soft error detection and correction circuitry is shown. Input and output signals 1002, 1004, 1028, and 1030 are the same as for circuit 1000. Devices 1006-1018 and 1024-1026 are also the same as for circuit 1000. The set of transistors 1122-1132 drive values onto a pair of feedback nodes fbp 1120 and fbn 1156 that are used for soft error detection and correction. The value on node fbp 1120 is also provided to a slave clock conditional gating circuitry such as the OAI gate 310 described earlier. The set of transistors 1134-1144 drive a value onto feedback node fb 1154, which is used as an input to transistors 1122-1124 and 1130-1132 in order to derive values for the feedback nodes fbp 1120 and fbn 1156, respectively. Also, the node qf 1152, the output of the slave transmission gate, is used as an input to derive values for these feedback nodes. Nodes qf 1152 and fb 1154 are inputs to inverters 1026 and 1028 in order to convey outputs QB 1030 and SDO 1028, respectively.

There are four storage nodes in circuit 1100 that are susceptible to radiation. They are nodes qf 1152, fb 1154, fbp 1120 and fbn 1156. Below is a description of a radiation hit, or a strike case, for each node and how circuit 1100 detects and recovers from each strike case. For each strike case, the input clock signal is disabled, which makes the slave transmission gate opaque. The reason for inspecting the opaque case is provided in the description above for FIG. 3. Due to this requirement, for each strike case, transistors 1014 and 1016 are always on and conduct. Also, transistors 1136 and 1142 are always off and do not conduct. Detection and recovery of soft errors described below does not require a clock pulse.

Strike Case 1: Negative charge is injected on node qf 1152

In this case, transistor 1144 turns on, transistor 1134 turns off, transistor 1138 remains on, and transistor 1140 remains off. Node fb 1154 is unaffected and remains at a logic high value. Therefore, the stored internal state is not lost by a temporary voltage pulse, or noise, induced by radiation. The feedback provided by the conducting transistors within the set 1012-1144 will remove the voltage noise on node qf 11152.

Strike Case 2: Positive charge is injected on node qf 1152

In this case, transistor 1144 turns off and transistor 1134 turns on. Series transistors 1134 and 1136 contend with parallel transistors 1140 and 1142. However, the channel width sizing may be done in order to ensure that transistors 1140 and 1142 are stronger and are able to discharge their output node. For example, in one embodiment, transistors 1134, 1136, 1140, and 1142 may all have equal channel widths. Node fb 1154 is unaffected and remains at a logic low value. The feedback provided by the conducting transistors within the set 1012-1144 will remove the voltage noise on node qf 1152.

Strike Case 3: Negative charge is injected on node fb 1154

In this case, transistor 1122 turns on, node fbp 1120 rises to a logic high value temporarily, and turns off transistor 1012. Node fbn 1156 is not charged up by transistor 1130 since transistor 1128 remains turned off. Transistor 1140 turns on, but transistor 1144 remains turned off. Node qf 1152 is unaffected, and therefore, node fb 1154 is allowed to recover.

Strike Case 4: Positive charge is injected on node fb 1154

In this case, transistor 1132 turns on, node fbn 1156 discharges, and transistor 1018 turns off. Transistor 1124 turns on, but it doesn't discharge node fbp 1120 since transistor 1126 remains off. Therefore, node qf 1152 remains at a logic low value and later node fb 1154 recovers.

Strike Case 5: Negative charge is injected on node fbp 1120

In this case, transistor 1012 turns on. Now series transistors 1012 and 1014 contend with series transistors 1016 and 1018. Node qf 1152 may be briefly charged up, but node fbn 1156 remains at a logic high value. Transistor 1128 may have been briefly turned off, but transistor 1130 remains on and transistor 1132 remains off. Therefore, node fbn 1156 does not discharge and node fb 1154 is unaffected.

Strike Case 6: Positive charge is injected on node fbn 1156

In this case, transistor 1018 turns on. Now series transistors 1012 and 1014 contend with series transistors 1016 and 1018. Node qf 1152 may be briefly discharged. Transistor 1126 may turn off, but transistor 1122 remains off. Therefore, node fbp 1120 remains at a logic low value. Transistor 1140 remains off and node fb 1154 is unaffected.

Although the embodiments above have been described in considerable detail, numerous variations and modifications will become apparent to those skilled in the art once the above disclosure is fully appreciated. It is intended that the following claims be interpreted to embrace all such variations and modifications

What is claimed is:

1. A flip-flop circuit comprising:
   a first stage configured to:
      receive an input data signal; and
      receive a first input clock signal; and
   a second stage comprising soft error recovery (SER) circuitry, wherein the second stage is configured to:
      receive a second input clock signal which is internally gated based on a state of the flip-flop;
      store a prebuffered data output on a first node; and
      store a feedback storage value on a second node different from the first node;
   wherein the SER circuitry is configured to:
      recover the prebuffered data value to an original value without a transition of a clock signal, in response to detecting an error; and
      recover the feedback value to an original value without a transition of a clock signal, in response to detecting an error.

2. The flip-flop circuit as recited in claim 1, wherein the SER circuitry comprises a first keeper circuit, a second keeper circuit, and a third keeper circuit.

3. The flip-flop circuit as recited in claim 2, wherein the first keeper circuit comprises:
   a first output corresponding to the prebuffered data output;
   a second input corresponds to a second output of the second keeper circuit; and
   a third input corresponds to a third output of the second keeper circuit.

4. The flip-flop circuit as recited in claim 3, wherein the second keeper circuit comprises:
   the second output;
   the third output;
   a fourth input is a fourth output of the third keeper circuit; and
   a fifth input is the prebuffered data output.

5. The flip-flop circuit as recited in claim 4, wherein the third keeper circuit comprises:
   the fourth output;
   a sixth input that corresponds to a gated input clock signal;
   a seventh input is the second output of the second keeper circuit; and
   an eighth input is the third output of the second keeper circuit.

6. The flip-flop circuit as recited in claim 5, wherein the prebuffered data output and the fourth output of the third keeper circuit have a same logic value.

7. The flip-flop circuit as recited in claim 6, further comprising each of the second output and the third output of the second keeper circuit have an inverted logic value of the fourth output of the third keeper circuit.

8. The flip-flop circuit as recited in claim 1, wherein said first stage is a master latch and said second stage is a slave latch.

9. The flip-flop circuit as recited in claim 8, further comprising a transition of the second input clock signal is dependent upon a clock gating condition.

10. The flip-flop circuit as recited in claim 9, wherein a transition of the second input clock signal is prevented when both the input data signal and the prebuffered data output having a same logic value.

11. The flip-flop circuit as recited in claim 10, wherein the first logic value is a logic high value.

12. The flip-flop circuit as recited in claim 10, wherein the first logic value is a logic low value.

13. An error recovery method in a multi-stage flip-flop, the method comprising:
   receiving in a first stage an input data signal and a first input clock signal;
   receiving in a second stage a second input clock signal which is internally gated based on a state of the flip-flop;
   storing in the second stage a prebuffered data output on a first node and a feedback storage value on a second node different from the first node;

recovering the prebuffered data value to an original value without a transition of a clock signal, in response to detecting an error; and recovering the feedback value to an original value without a transition of a clock signal, in response to detecting an error.

14. The method as recited in claim 13, wherein the second stage comprises a first keeper circuit, a second keeper circuit, and a third keeper circuit.

15. The method as recited in claim 14, further comprising the first keeper circuit:
conveying the prebuffered data output as a first output;
receiving the second input clock signal as a first input;
receiving a second output of the second keeper circuit as a second input; and
receiving a third output of the second keeper circuit as a third input.

16. The method as recited in claim 15, further comprising the second keeper circuit:
conveying the second output;
conveying the third output;
receiving a fourth output of the third keeper circuit as a fourth input; and
receiving the prebuffered data output as a fifth input.

17. The method as recited in claim 16, further comprising the third keeper circuit:
conveying the fourth output;
receiving the second input clock signal as a sixth input;
receiving the second output of the second keeper circuit a seventh input; and
receiving the third output of the second keeper circuit as an eighth input.

18. The method circuit as recited in claim 17, wherein the prebuffered data output and the fourth output of the third keeper circuit have a same logic value.

19. The method as recited in claim 13, wherein said first stage is a master latch and said second stage is a slave latch.

20. The method as recited in claim 19, further comprising preventing a transition of the second input clock signal when both the input data signal and the prebuffered data output having a same logic value.

\* \* \* \* \*